United States Patent
Qian et al.

(10) Patent No.: US 10,566,187 B2
(45) Date of Patent: Feb. 18, 2020

(54) ULTRATHIN ATOMIC LAYER DEPOSITION FILM ACCURACY THICKNESS CONTROL

(71) Applicant: Lam Research Corporation, Fremont, CA (US)

(72) Inventors: Jun Qian, Sherwood, OR (US); Hu Kang, Tualatin, OR (US); Adrien LaVoie, Newberg, OR (US); Seiji Matsuyama, Toyama (JP); Purushottam Kumar, Hillsboro, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/664,545

(22) Filed: Mar. 20, 2015

(65) Prior Publication Data

US 2016/0276148 A1 Sep. 22, 2016

(51) Int. Cl.
*C23C 16/40* (2006.01)
*H01L 21/02* (2006.01)

(52) U.S. Cl.
CPC .... *H01L 21/0228* (2013.01); *H01L 21/02164* (2013.01); *H01L 21/02211* (2013.01); *H01L 21/02274* (2013.01)

(58) Field of Classification Search
CPC ...... C23C 16/40; C23C 16/401; C23C 16/402; C23C 16/45525; C23C 16/45542
See application file for complete search history.

(56) References Cited

U.S. PATENT DOCUMENTS

| | | | | |
|---|---|---|---|---|
| 7,595,263 | B2 * | 9/2009 | Chung | C23C 16/02 257/E21.171 |
| 7,625,820 | B1 * | 12/2009 | Papasouliotis | C23C 14/046 257/E21.553 |
| 7,897,208 | B2 * | 3/2011 | Mahajani | C23C 16/45534 427/248.1 |

(Continued)

FOREIGN PATENT DOCUMENTS

| CN | 101802984 A | 8/2010 |
|---|---|---|
| CN | 103946963 A | 7/2014 |

OTHER PUBLICATIONS

Hiller, D., et al.,"Low temperature of silicon dioxide by thermal atomic layer deposition: Investigation of material properties". Journal of Applied Physics 107, 064313 (2010), pp. 1-10.*

(Continued)

*Primary Examiner* — Bret P Chen
(74) *Attorney, Agent, or Firm* — Weaver Austin Villeneuve & Sampson LLP

(57) ABSTRACT

Methods for depositing ultrathin films by atomic layer deposition with reduced wafer-to-wafer variation are provided. Methods involve exposing the substrate to soak gases including one or more gases used during a plasma exposure operation of an atomic layer deposition cycle prior to the first atomic layer deposition cycle to heat the substrate to the deposition temperature.

19 Claims, 5 Drawing Sheets

(56) References Cited

U.S. PATENT DOCUMENTS

| | | | |
|---|---|---|---|
| 7,964,505 B2* | 6/2011 | Khandelwal | C23C 16/0281 257/E21.171 |
| 2004/0221807 A1 | 11/2004 | Verghese et al. | |
| 2006/0128150 A1* | 6/2006 | Gandikota | C23C 16/0281 438/681 |
| 2007/0065578 A1* | 3/2007 | McDougall | C23C 16/4404 427/248.1 |
| 2008/0274626 A1* | 11/2008 | Glowacki | C23C 16/0272 438/787 |
| 2010/0081290 A1* | 4/2010 | Luo | C23C 16/40 438/761 |
| 2012/0255612 A1* | 10/2012 | Pierreux | H01L 21/02178 136/261 |
| 2013/0126986 A1* | 5/2013 | Brodsky | H01L 21/28255 257/411 |
| 2014/0154883 A1 | 6/2014 | Humayun et al. | |
| 2014/0287164 A1* | 9/2014 | Xiao | C07F 7/0896 427/579 |
| 2014/0361364 A1* | 12/2014 | Chen | H01L 29/408 257/336 |
| 2015/0087139 A1* | 3/2015 | O'Neill | C23C 16/24 438/482 |

OTHER PUBLICATIONS

Han, Lei, et al., "High-Quality Thin SiO2 Films Grown by Atomic Layer Deposition Using Tris(dimethylamino)silane (TDMAS) and Ozone". ECS Journal of Solid State Science and Technology, 2 (11) N228-N236 (2013).*

Burton, B.B., et al., "SiO2 Atomic Layer Deposition Using Tris(dimethylamino)silane and Hydrogen Peroxide Studied by in Situ Transmission FTIR Spectroscopy". J. Phys. Chem. C 2009, 113, 8249-8257.*

Jung, Hanearl, et al., "Growth characteristics and electrical properties of SiO2 thin films prepared using plasma-enhanced atomic layer deposition and chemical vapor deposition with an aminosilane precursor". J. Mater. Sci (2016) 51:5082-5091.*

Chinese First Office Action dated Apr. 3, 2018 issued in Application No. CN 201610160517.6.

Chinese Second Office Action dated Feb. 27, 2019 issued in Application No. CN 201610160517.6.

Chinese Third Office Action dated Sep. 23, 2019 issued in Application No. CN 201610160517.6.

* cited by examiner

ULTRATHIN ATOMIC LAYER DEPOSITION FILM ACCURACY THICKNESS CONTROL

BACKGROUND

Various thin film layers for semiconductor devices may be deposited with atomic layer deposition (ALD) processes. However, existing ALD processes may not be suitable for depositing ultrathin films having a thickness less than about 50 Å. For example, many existing ALD processes for depositing ultrathin films result in a high wafer-to-wafer variation between films deposited from substrate to substrate.

SUMMARY

Methods and apparatuses for processing semiconductor substrates are provided herein. One aspect involves a method for depositing a silicon oxide film by atomic layer deposition on a semiconductor substrate by: (a) inserting a substrate into a chamber; (b) after inserting the substrate into the chamber and prior to performing a first cycle of atomic layer deposition at a deposition temperature, raising the substrate's temperature to about the deposition temperature by exposing the substrate to a soak gas for a duration of about 500 seconds or less; and (c) performing the atomic layer deposition, whereby a cycle of the atomic layer deposition includes exposing the substrate to a silicon-containing precursor in a non-plasma environment for a duration sufficient to substantially adsorb the silicon-containing precursor to the surface of the substrate and exposing the substrate to an oxidant in a plasma environment to form at least a portion of the silicon oxide film; where soaking the substrate includes exposing the substrate to a soak gas including only one or more gases used when exposing the substrate to the oxidant in the plasma environment during the atomic layer deposition cycle to form the at least a portion of the silicon oxide film; and where the thickness of the silicon oxide film deposited by the atomic layer deposition is less than about 5 nm.

The soak gas in (b) may contain only a gas or gases used when exposing the substrate to the oxidant in the plasma environment to form the at least a portion of the silicon oxide film. In some embodiments, the soak gas in (b) includes two or more gases, and no other gases, used when exposing the substrate to the oxidant in the plasma environment to form the at least a portion of the silicon oxide film, and where the two or more gases are present in the soak gas in substantially the same proportion as they are in the oxidant.

In various embodiments, the soak gas in (b) is selected from the group consisting of argon, nitrogen, oxygen, nitrous oxide, and combinations thereof. The soak gas in (b) may include no helium.

The flow rate of the soak gas in (b) may be within about 10% of a maximum flow rate achievable by the chamber. In some embodiments, the flow rate of the soak gas in (b) is at least about 15 slm. In various embodiments, the flow rate of the soak gas in (b) is at least about 25% to about 200% of the flow rate of the one or more gases used when exposing the substrate to the oxidant in the plasma environment during the atomic layer deposition cycle.

Wafer-to-wafer variation of the average silicon oxide film thickness over the surface of the substrate may be less than about ±2 Å.

In various embodiments, (c) includes performing two or more atomic layer deposition cycles to deposit the silicon oxide film on the substrate. In some embodiments, between two and about fifty atomic layer deposition cycles are performed.

The silicon-containing precursor may be selected from the group consisting of silane, disilane, trisilane, tetrasilane, halogen-substituted versions of any of the foregoing silanes, amine-substituted versions of any of the foregoing silanes, and trisilylamine. The oxidant may be selected from the group consisting of oxygen, nitrous oxide, and combinations thereof. The atomic layer deposition may be performed at a temperature of between about 30° C. and about 70° C. In various embodiments, the cycle of the atomic layer deposition further includes purging the chamber between each exposing operation.

Another aspect involves a method for depositing a film by atomic layer deposition on a semiconductor substrate by: (a) inserting a substrate into a chamber; and (b) after inserting the substrate into the chamber and prior to performing a first cycle of atomic layer deposition at a deposition temperature, raising the substrate's temperature to about the deposition temperature by exposing the substrate to a soak gas for a duration of about 500 seconds or less; and (c) performing the atomic layer deposition, where a cycle of the atomic layer deposition includes exposing the substrate to a precursor in a non-plasma environment for a duration sufficient to substantially adsorb the precursor to the surface of the substrate, and exposing the substrate to a second reactant in a plasma environment to form at least a portion of the film; and where soaking the substrate includes exposing the substrate to a soak gas including only one or more gases used when exposing the substrate to the second reactant in the plasma environment during the atomic layer deposition cycle to form the at least a portion of the film; and where the thickness of the film deposited by the atomic layer deposition is less than about 5 nm.

The soak gas in (b) may contain only a gas or gases used when exposing the substrate to the second reactant in the plasma environment to form the at least a portion of the film. In various embodiments, the soak gas in (b) includes two or more gases, and no other gases, used when exposing the substrate to the second reactant in the plasma environment to form the at least a portion of the film, and where the two or more gases are present in the soak gas in substantially the same proportion as they are in the second reactant.

The soak gas in (b) may be selected from the group consisting of argon, nitrogen, oxygen, nitrous oxide, and combinations thereof. The soak gas in (b) may include no helium.

In various embodiments, the flow rate of the soak gas in (b) is within 10% of a maximum flow rate achievable by the chamber. In some embodiments, the flow rate of the soak gas in (b) is at least about 15 slm. In various embodiments, the flow rate of the soak gas in (b) is at least about 25% to about 200% of the flow rate of the one or more gases used when exposing the substrate to the oxidant in the plasma environment during the atomic layer deposition cycle.

Wafer-to-wafer variation of the average film thickness over the surface of the substrate may be less than about ±2 Å. In some embodiments (c) includes performing two or more atomic layer deposition cycles to deposit the film on the substrate. For example, in some embodiments, between two and about fifty atomic layer deposition cycles are performed.

The film deposited by the atomic layer deposition may be selected from the group consisting of silicon oxide, silicon nitride, silicon carbide, metal oxide, doped silicon oxide, doped silicon nitride, doped silicon carbide, and doped metal oxide. In some embodiments, the film deposited by the atomic layer deposition is an oxide and the atomic layer deposition is performed at a temperature of about 50° C. In some embodiments, the film deposited by the atomic layer deposition is a nitride or carbide and the atomic layer deposition is performed at a temperature of between about 200° C. and about 300° C.

The precursor may include a chemical selected from the group consisting of silicon, metals, electron-donating atoms, and electron-donating groups. In various embodiments, the second reactant is a reductant or oxidant.

The cycle of the atomic layer deposition may further include purging the chamber between each exposing operation.

Another aspect involves an apparatus for processing semiconductor substrates, the apparatus including: (a) one or more stations, each reaction station including a pedestal for holding a substrate; (b) at least one outlet for coupling to a vacuum; (c) one or more process gas inlets for coupling to precursor and reactant sources; (d) a robot for inserting substrates into the one or more reaction chambers; and (e) a controller for controlling operations in the apparatus, including machine-readable instructions for: (i) inserting a substrate into one of the one or more stations, (ii) introducing a soak gas for a duration of about 500 seconds or less; (iii) introducing a silicon-containing precursor for a duration sufficient to substantially adsorb the silicon-containing precursor onto the surface of the substrate; (iv) introducing a second reactant into the one or more reaction chambers and igniting a plasma; and (v) repeating (iii) and (iv) to form a film on the substrate, the film having a thickness less than about 5 nm, where the soak gas in (ii) includes only one or more gases used in (iv).

The controller may further include machine-readable instructions for performing (ii) at least once after each new substrate is inserted into one of the one or more stations by the robot. In some embodiments, the apparatus includes two or more stations.

These and other aspects are described further below with reference to the drawings.

DETAILED DESCRIPTION

Figure 1:
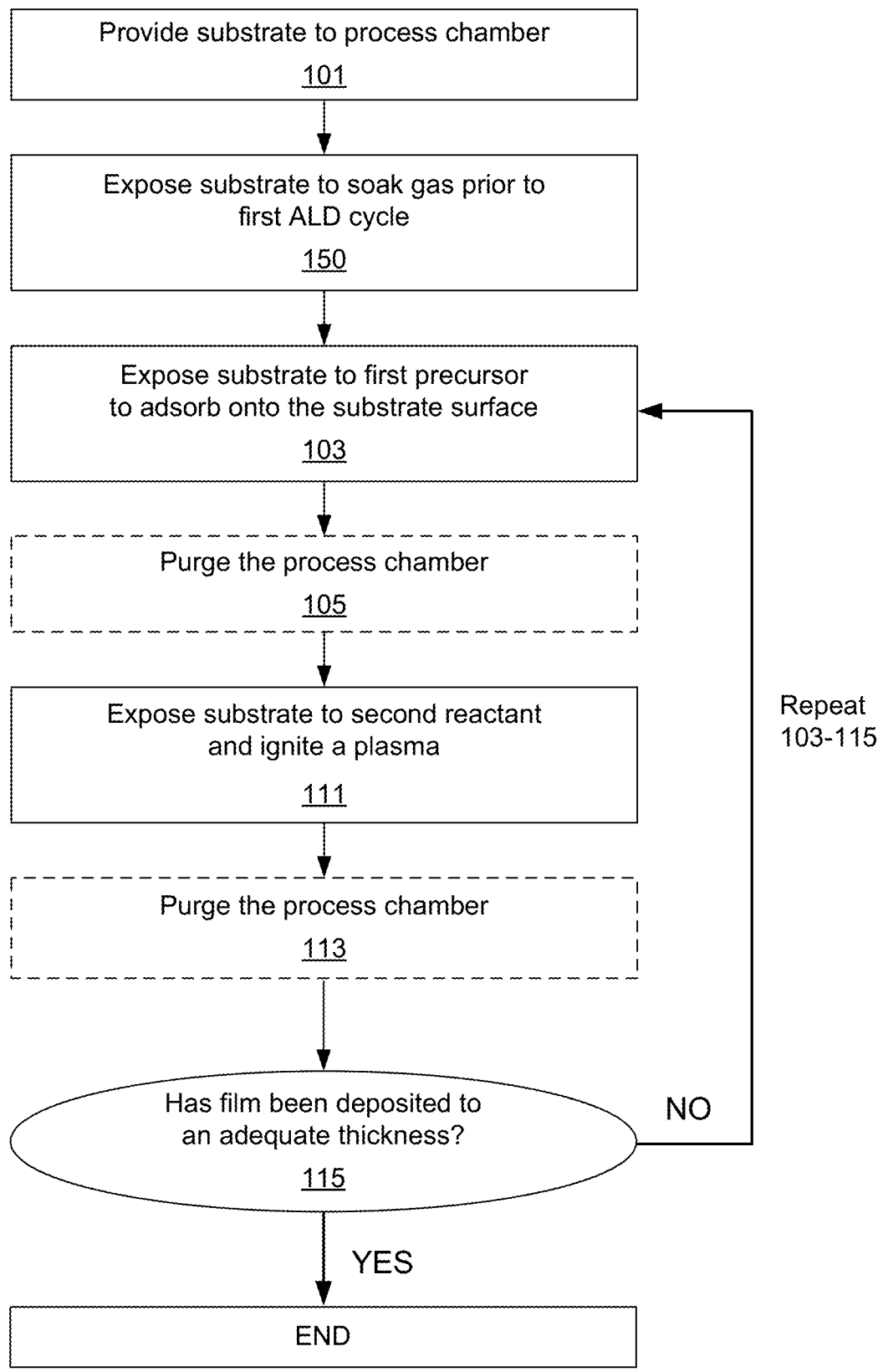
FIG. 1 is a process flow diagram depicting operations of a method in accordance with disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Manufacture of semiconductor devices typically involves depositing one or more conformal thin films on a substrate in an integrated fabrication process. For example, some front-end-of-the-line processes may involve deposition of conformal films by atomic layer deposition (ALD). ALD is a technique that deposits thin layers of material using sequential self-limiting reactions. ALD processes use surface-mediated deposition reactions to deposit films on a layer-by-layer basis in cycles. As an example, an ALD cycle may include the following operations: (i) delivery/adsorption of a silicon-containing precursor, (ii) purging of silicon-containing precursor from the chamber, (iii) delivery of a second reactant and ignite plasma, and (iv) purging of byproducts from the chamber.

As devices shrink, conformal layers become thinner and fewer and fewer ALD cycles are used to deposit a film on a substrate. As a result, it is desirable to accurately control film thickness from substrate to substrate. Film thickness of a substrate may be measured by taking an average film thickness over the surface of the substrate. Variation in thickness from substrate to substrate may be known as "wafer-to-wafer variation." In thicker films deposited by ALD, variations in thickness in initial cycles of ALD has a smaller impact than in thinner films because there are more cycles of ALD performed in depositing a thicker film. For example, a wafer-to-wafer variation of ±5 Å in thickness between films deposited to a thickness of 500 Å is a small fraction compared to a wafer-to-wafer variation of ±5 Å in thickness between films having a thickness of 10 Å. Thus, for deposition of ultrathin films, such as films having an average film thickness less than about 50 Å, accurate control of wafer-to-wafer variation is of particular interest. Ultrathin films may be used in various applications, such as fabrication of front-end-of-line spacers, plug liners, and cap layers. As devices shrink, other forms of variation also become problematic. Such variations include within wafer variation: i.e., layer thickness variations from one position to another position on a single wafer. While most of the discussion herein concerns wafer-to-wafer variations, the disclosed improvements may be equally applicable to other forms of variation.

Variation may depend on a number of factors, including the chamber conditions prior to performing ALD cycles on a substrate. Conventional ALD methods typically begin by placing a substrate on a pedestal in a chamber or station, which may be part of an apparatus, reactor, or tool for fabricating semiconductor substrates. To perform ALD at a desired deposition temperature, the pedestal is set to a desired deposition temperature and once the substrate is placed on the pedestal, the substrate is heated such that the substrate temperature is approximately the same as the pedestal temperature. Prior to being placed on the pedestal, the substrate may be at a temperature different from that of the pedestal temperature. For example, substrate temperatures may be at room temperature, such that the substrate temperature is raised to a deposition temperature on the pedestal. Conventional methods for stabilizing the substrate temperature involved exposing the substrate to certain conditions to more efficiently bring the substrate temperature up to a temperature at or near the deposition temperature. Exposure to these conditions is sometimes called "soak." To increase throughput and reduce the time required for the substrate temperature to be raised, conventionally the wafer is exposed to helium, which has a high thermal conductivity, to stabilize the substrate temperature. However, conventional methods contaminate or increase the wafer-to-wafer variation of films deposited between substrates. For example, although the chamber may be purged after the substrate is exposed to helium, some helium may still be present in the chamber such that when the plasma ignites, the plasma has a slight purple color, which is consistent with helium plasma, and nucleation and incubation periods for the ALD process are affected, thereby increasing wafer-to-wafer variation between substrates.

Provided herein are methods of soaking a substrate prior to performing ALD to reduce wafer-to-wafer variation between substrates. Methods may be used to deposit ultrathin films, which are defined as films having a thickness of about 50 Å or less, or about 30 Å or less, or about 20 Å or less, or about 10 Å or less. Methods involve exposing the substrate to a soak gas including one or more gases used with the second reactant of an ALD cycle. In various embodiments, the soak gas only includes gases used with the second reactant of an ALD cycle. Deposited films are uniform from substrate to substrate, with wafer-to-wafer variation less than about ±2Å for deposition of ultrathin films, or less than about ±1 Å. In various embodiments, wafer-to-wafer variation of less than about ±2 Å is achieved where between about 2 and about 10 cycles of ALD are performed. Disclosed embodiments are suitable for deposition of any film deposited by ALD, such as dielectric films, metal films, semiconductor films, and films of any material used in the fabrication of semiconductor substrates. For example, disclosed embodiments may be used to deposit silicon oxide (SiO), silicon nitride (SiN), silicon carbide (SiC), silicon oxynitride (SiON), silicon oxycarbonitride (SiOCN), metal oxide, doped silicon oxide, doped silicon nitride, doped silicon carbide, or doped metal oxide. In some embodiments, disclosed embodiments may be used to deposit titanium nitride, tantalum nitride, tungsten, aluminum oxide, and aluminum nitride. The deposited materials may have normal stoichiometry (e.g., $SiO_2$) or variants thereof.

The methods provided herein involve deposition by ALD. Unlike a chemical vapor deposition (CVD) technique, ALD processes use surface-mediated deposition reactions to deposit films on a layer-by-layer basis. In one example of an ALD process, a substrate surface, including a population of surface active sites, is exposed to a gas phase distribution of a first precursor in a dose provided to a process station housing the substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. In certain embodiments, an ALD precursor dose partially saturates the substrate surface. In some embodiments, the dose phase of an ALD cycle concludes before precursor contacts the substrate to evenly saturate the surface. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587, filed Oct. 23, 2013, titled "SUB-SATURATED ATOMIC LAYER DEPOSITION AND CONFORMAL FILM DEPOSITION," which is incorporated herein by reference in its entirety. After a first precursor dose, the reactor is then evacuated to remove any first precursor remaining in gas phase so that only the adsorbed species remain. A second reactant is introduced to the reactor so that some of these molecules react with the first precursor adsorbed on the surface. In some processes, the second reactant reacts immediately with the adsorbed first precursor. In other embodiments, the second reactant reacts only after a source of activation is applied, such as plasma. In various embodiments described herein, the second reactant reacts with the adsorbed first precursor when a plasma is ignited. The reactor may then be evacuated again to remove unbound second reactant molecules. In some implementations, the ALD methods include plasma activation. As described herein, the ALD method and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in its entireties.

The concept of an ALD "cycle" is relevant to the discussion of various embodiments herein. Generally a cycle is the minimum set of operations used to perform a surface deposition reaction one time. The result of one cycle is production of at least a partial silicon oxide film layer on a substrate surface. Typically, an ALD cycle includes operations to deliver and adsorb at least one reactant to the substrate surface, and then react the adsorbed reactant with one or more reactants to form the partial layer of film. The cycle may include certain ancillary operations such as sweeping one of the reactants or byproducts and/or treating the partial film as deposited. Generally, a cycle contains one instance of a unique sequence of operations. ALD cycles may be used to build film thickness.

Figure 2:
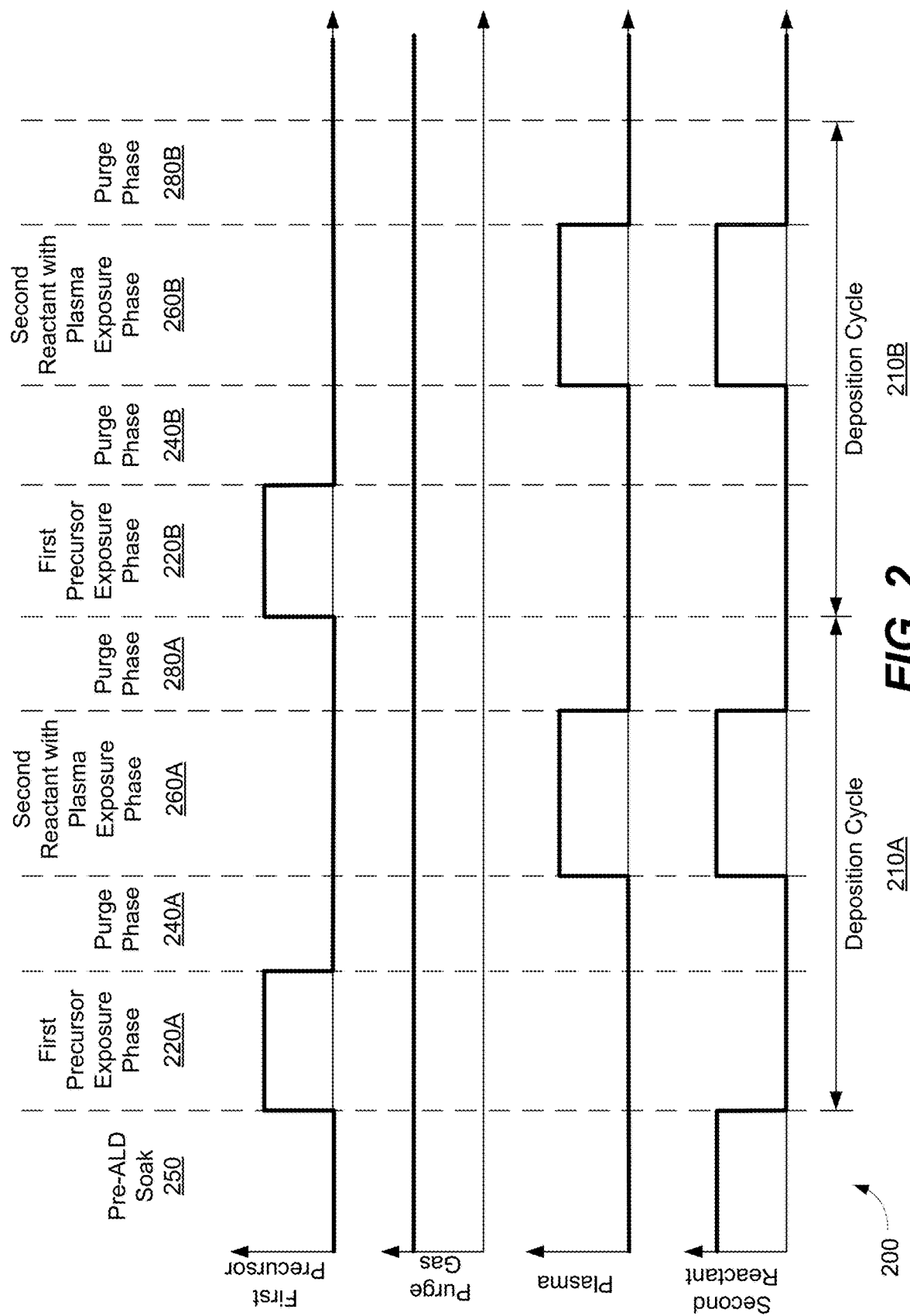
FIG. 2 is a timing sequence diagram showing an example of cycles in a method in accordance with disclosed embodiments.

FIG. 1 provides a process flow diagram for performing operations in accordance with disclosed embodiments. FIG. 2 is a timing sequence diagram of example pulses in accordance with disclosed embodiments. FIG. 2 shows phases in an example ALD process 200, for various process parameters, such as carrier gas flow, first precursor flow, plasma, and second reactant flow. FIG. 2 includes two deposition cycles 210A and 210B and a pre-ALD soak 250 prior to the first ALD cycle (deposition cycle 210). The lines indicate when the flow or plasma is turned on and off, accordingly. FIGS. 1 and 2 will be described together below.

In operation 101 of FIG. 1, a substrate is provided to a process chamber. The process chamber includes a pedestal or substrate holder where the substrate is placed. The substrate may be a silicon wafer, e.g., a 200-mm wafer, a 300-mm wafer, or a 450-mm wafer, including wafers having one or more layers of material, such as dielectric, conducting, or semi-conducting material deposited thereon. Substrates may have "features" such as via or contact holes, which may be characterized by one or more of narrow and/or re-entrant openings, constrictions within the feature, and high aspect ratios. The feature may be formed in one or more of the above described layers. One example of a feature is a hole or via in a semiconductor substrate or a layer on the substrate. Another example is a trench in a substrate or layer. In various embodiments, the feature may have an underlayer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In some embodiments, the feature may have an aspect ratio of at least about 2:1, at least about 4:1, at least about 6:1, at least about 10:1, or higher. The feature may also have a dimension near the opening, e.g., an opening diameter or line width of between about 10 nm to 500 nm, for example between about 25 nm and about 300 nm. Disclosed methods may be performed on substrates with features having an opening less than about 150 nm. A feature via or trench may be referred to as an unfilled feature or a feature. A feature that may have a re-entrant profile that narrows from the bottom, closed end, or interior of the feature to the feature opening.

During operation 101, the pedestal is set to a deposition temperature. For example, the pedestal may be set to the temperature to be used during deposition of a film by ALD in subsequent operations. In various embodiments, the pedestal is set to a temperature greater than room temperature, or greater than about 20° C., or greater than about 25° C. The deposition temperature depends on the type of film to be deposited on the substrate and the chemistry used for depositing the film. For example, in some embodiments, deposition temperature for depositing an oxide may be less than about 100° C., or less than about 50° C., or about 50° C. In some embodiments, deposition temperature for depositing a nitride or carbide may be less than about 400° C., or less than about 300° C., or less than about 200° C., or between about 200° C. and about 300° C. In some embodiments, deposition temperature may be greater than about 400° C.

In operation 150, the substrate is exposed to a soak gas prior to performing the first cycle of ALD on the substrate. The substrate is exposed to the soak gas to raise the temperature of the substrate to a temperature at or near the deposition temperature. For example, a substrate inserted into to the process chamber from an outside environment may be at a room temperature of about 20° C., and the substrate is exposed to a soak gas to raise the temperature of the substrate to a temperature of about 50° C. for oxide deposition. The process of raising the substrate temperature when exposed to the soak gas is referred to as "soak."

In various embodiments, the soak gas is helium-free, such that no helium is present in the process chamber during operation 150. The soak gas may be a carrier gas or any second reactant used in ALD, or any combination thereof. In various embodiments, the soak gas is one or more gases used with the second reactant in the plasma step of the ALD cycle, which is described below with respect to operation 111. Additional examples of soak gases include argon (Ar), helium (He), hydrogen ($H_2$), xenon (Xe), krypton (Kr), nitrogen ($N_2$), oxygen ($O_2$), nitrous oxide ($N_2O$), ammonia ($NH_3$), hydrazine, ozone ($O_3$), nitric oxide (NO), nitrogen dioxide ($NO_2$), carbon monoxide (CO), carbon dioxide ($CO_2$), sulfur monoxide (SO), and water ($H_2O$). In some implementations, the soak gas contains no gases other than gases present when the second reactant is introduced during the ALD cycle. For example, if the only gases present during this phase are argon, oxygen, and nitrous oxide, the soak gas would include one or more of argon, oxygen, and nitrous oxide, but no other gases.

For deposition of silicon oxide, the soak gas may be an oxidant and/or a carrier gas used when the substrate is exposed to the oxidant in a plasma environment in an ALD cycle. Examples of soak gases for deposition of silicon oxide include, but are not limited to, Ar, $N_2$, $O_2$, $N_2O$, $O_3$, peroxides including hydrogen peroxide ($H_2O_2$), $H_2O$, alcohols such as methanol, ethanol and isopropanol, NO, $NO_2$, CO, and $CO_2$. In some embodiments, the oxidizer may be a mixture of $O_2$ and a weak oxidizer such as $N_2O$, CO, $CO_2$, NO, $NO_2$, SO, $SO_2$, $C_xH_yO_z$ and/or $H_2O$.

For deposition of silicon nitride, the soak gas may be a nitrogen-containing reactant and/or a carrier gas used when the substrate is exposed to the nitrogen-containing reactant in a plasma environment in an ALD cycle. Example soak gases for deposition of silicon nitride include Ar, $H_2$, $N_2$, and $NH_3$. Additional examples of nitrogen-containing reactants include compounds containing at least one nitrogen, for example, hydrazine, amines (amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

The composition of soak gases used may depend on the composition used when the substrate is exposed to the second reactant in a plasma environment of an ALD cycle. In some embodiments, the soak gas contains only carrier gas. In some embodiments, the soak gas contains only the second reactant.

All percentages and ratios listed herein are by flow rate. In some embodiments, the composition of soak gases in operation 150 is identical to the composition of gases in operation 111. In some embodiments, the composition of soak gases in operation 150 is different from the composition of gases in operation 111. For example, the flow rate of soak gases in operation 150 may be at least about 25% to at least about 200% of the flow rate of the gases in operation 111. In some embodiments, the composition of soak gases in operation 150 includes a carrier gas and the second reactant, where the second reactant may include one or more gases, and the flow rate of the carrier gas may be between about 25% and about 200% of the flow rate of the carrier gas in operation 111 Likewise, the flow rate of the second reactant in operation 150 may be at least about 25% to about 200% of the flow rate of the second reactant in operation 111.

For example, in deposition of oxides, the composition of soak gases may include argon, nitrogen, and oxygen. The flow rate of each of argon, nitrogen, and oxygen may be at least about 25% to about 200% of the flow rate of argon, nitrogen, and oxygen respectively used in operation 111. In another example, the composition of soak gases used prior to depositing an oxide may include nitrous oxide and oxygen such that the flow rate ratio of nitrous oxide to oxygen may be between about 1:5 and about 2:1.

In deposition of nitrides, example compositions of soak gases may include compositions having a carrier gas and a nitrogen-containing gas. In deposition of metal compounds, example compositions of soak gases may include compositions including a carrier gas and a nitrogen-containing gas. The carrier gas and the nitrogen-containing gas may be at least about 25% to about 200% of the flow rate of the respective gas used when the carrier gas and nitrogen-containing gas are used in operation 111.

In deposition of carbides, example compositions of soak gases may include a carrier gas, and a carbon-containing gas. The carrier gas and the carbon-containing gas may be at least about 25% to about 200% of the flow rate of the respective gas used when the carrier gas and carbon-containing gas are used in operation 111.

The flow rate of the soak gases during operation 150 may be at least about 500 sccm for a chamber including four stations, each station of which includes a substrate. In some embodiments, the flow rate of the soak gases during operation 150 is within about 10% of a maximum flow rate achievable by the chamber. For example, the flow rate of the soak gases may be at least about 15 slm, or at least about 20 slm, or between about 15 slm and about 20 slm, for example about 17 slm.

In operation 150, the substrate is exposed to the soak gas or gases for a short period of time. A short period is defined as a duration less than about 150 seconds, or less than about 100 seconds, or less than about 60 seconds. For example, the substrate may be exposed to the soak gas or gases for a duration between about 5 seconds and about 60 seconds, for example, about 5 seconds.

Operation 150 may be performed each time a new substrate is inserted into a process chamber in the apparatus, which may be a multi-station tool including one or more stations. In some embodiments, the apparatus includes four stations for processing substrates. Further description of example apparatuses are described below with respect to FIGS. 3 and 4. In various embodiments, every time a new substrate is inserted into the tool, such as into one of stations in a multi-station tool, operation 150 may be performed. Operation 150 thus may be performed before every first cycle of ALD for any single substrate in a chamber of a multi-station tool. Operation 150 may be performed even if other substrates in a multi-station tool have partially deposited ALD films. In some embodiments, the chamber is purged after operation 150. It should be understood that multi-station tools may be operated in various modes. In some modes, all substrates are inserted and then processed to completion before any substrate is removed. In other modes, one substrate is removed and another is inserted each time the substrates index from one station to the next within the tool. In other modes, two substrates are added and two are removed, but at least two others remain during certain index operations. Other modes can be employed.

FIG. 2 shows a pre-ALD soak 250 prior to the first ALD deposition cycle 210. During pre-ALD soak 250, which may correspond to operation 150 of FIG. 1, the first precursor is turned off, and the plasma is turned off, while the purge gas or carrier gas and second reactant are turned on. Note that the on/off condition for the pre-ALD soak 250 is the same as the on/off conditions shown for the second reactant with plasma exposure phases 260A and 260B. Note that in some embodiments, the carrier gas is not flowed during the pre-ALD soak 250. As explained elsewhere, various combinations of the gases employed in operation 260B may be used in the soak.

Returning to FIG. 1, operations 103-113 may be operations of an ALD cycle. During operations 103-113, an inert gas may be flowed. In some embodiments, the inert gas is flowed during operations 150-113. Disclosed embodiments may be performed at a chamber pressure between about 0.1 Torr and about 20 Torr. In various embodiments, the inert gas is used as a carrier gas. Example carrier gases include argon (Ar), helium (He), hydrogen ($H_2$), oxygen ($O_2$), krypton (Kr), xenon (Xe), and neon (Ne). The inert gas may be provided to assist with pressure and/or temperature control of the process chamber, evaporation of a liquid reactant, more rapid delivery of the reactant and/or as a purge gas for removing process gases from the process chamber and/or process chamber plumbing. The example sequences in FIG. 2 shows a carrier gas, which is continuously flowed during the entire process.

In operation 103 of FIG. 1, the substrate is exposed to a first precursor such that the first precursor adsorbs on to the substrate surface. In some embodiments, the first precursor adsorbs onto the substrate surface in a self-limiting manner such that once active sites are occupied by the first precursor, little or no additional first precursor will be adsorbed on the substrate surface. In various embodiments, when the first precursor is flowed to the station, the first precursor adsorbs onto active sites on the surface of the substrate, forming a thin layer of the first precursor on the surface. In various embodiments, this layer may be less than a monolayer, and may have a thickness between about 0.2 Å and about 0.8 Å.

In various embodiments, the first precursor includes an electron-donating atom or electron-donating group. In various embodiments, the first precursor is a silicon-containing precursor or a metal-containing precursor. In some embodiments, the first precursor is a silicon-containing precursor suitable for depositing a silicon oxide film by ALD. The first precursor may also be a mixture of two or more compounds. In some embodiments, the silicon-containing precursor is chosen depending on the type of silicon-containing film to be deposited.

Example silicon-containing precursors include, but are not limited to, silanes, polysilanes, halosilanes, and aminosilanes. A silane contains hydrogen and/or carbon groups, but does not contain a halogen. A polysilane may have the formula ($H_3Si$—$(SiH_2)_n$—$SiH_3$), where n≥1. Examples of silanes include silane ($SiH_4$), disilane ($Si_2H_6$), trisilane, tetrasilane and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, tetra-ethyl-ortho- silicate (also known as tetra-ethoxy-silane or TEOS) and the like.

A halosilane contains at least one halogen group and may or may not contain hydrogens and/or carbon groups. A halosilane may have a formula $SiX_aH_y$, whereby X=Cl, F, I, or Br, and a+y=4, where a≥1. A halosilane may have a formula $SiX_aH_y(CH_3)_z$ where X=Cl, F, I, or Br, and a+y+z=4, where a≥1. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing precursor is not present when a plasma is struck. Specific chlorosilanes are tetrachlorosilane ($SiCl_4$), trichlorosilane ($HSiCl_3$), dichlorosilane ($H_2SiCl_2$), monochlorosilane (Cl-$SiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro- sec-butylsilane, t-butyldimethylchlorosilane, thexyldimethylchlorosilane, monochlorotrimethylsilane, and the like.

An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis (tertiarybutylamino)silane ($SiH_2$(NHC (CH$_3$)$_3$)$_2$ (BTBAS), tert-butyl silylcarbamate, SiH(CH$_3$)—(N(CH$_3$)$_2$)$_2$, SiHCl—(N(CH$_3$)$_2$)$_2$, (Si(CH$_3$)$_2$NH)$_3$, di(sec-butylamino)silane (DSBAS), di(isopropylamido)silane (DIPAS), bis(diethylamino)silane (BDEAS), and the like. A further example of an aminosilane is trisilylamine (N(SiH$_3$)$_3$).

Examples of silicon-containing precursors for depositing silicon carbide include siloxanes, alkyl silane or hydrocarbon-substituted silane, or a nitrogen-containing carbon-containing reactant. Example siloxanes include 2,4,6,8-tetramethylcyclotetrasiloxane (TMCTS), heptamethylcyclotetrasiloxane (HMCTS), silsesquioxane, disiloxanes, such as pentamethyldisiloxane (PMDSO) and tetramethyldisiloxane (TMDSO), and trisiloxanes such as hexamethyltrisiloxane, heptamethyltrisiloxane. Alkyl silanes include a central silicon atom with one or more alkyl groups bonded to it as well as one or more hydrogen atoms bonded to it. In some embodiments, any one or more of the alkyl groups contain 1-5 carbon atoms. The hydrocarbon groups may be saturated or unsaturated (e.g., alkene (e.g., vinyl), alkyne, and aromatic groups). Examples include but are not limited to trimethylsilane (3MS), triethylsilane, pentamethyl disilamethane ((CH$_3$)$_2$Si—CH$_2$—Si(CH$_3$)$_3$), and dimethylsilane (2MS). Additionally, disilanes, trisilanes, or other higher silanes may be used in place of monosilanes. In some embodiments, one of the silicon atoms can have a carbon-containing or hydrocarbon group attached to it, and one of the silicon atoms can have a hydrogen atom attached to it. Example carbon-containing reactants including a nitrogen include methyl-substituted disilazanes and trisilazanes, such as tetramethyldisilazane and hexamethyl trisilazane.

Example first precursors used for depositing oxygen-doped silicon carbide films include siloxanes such as cyclotetrasiloxanes such as heptamethylcyclotetrasiloxane (HMCTS) and tetramethylcyclotetrasiloxane. Other cyclic siloxanes can also include but are not limited to cyclotrisiloxanes and cyclopentasiloxanes. For depositing oxygen doped silicon carbide films, other examples of suitable precursors include linear siloxanes such as, but not limited to, disiloxanes, such as pentamethyldisiloxane (PMDSO), tetramethyldisiloxane (TMDSO), hexamethyl trisiloxane, and heptamethyl trisiloxane. For undoped silicon carbide, examples of suitable precursors include monosilanes substituted with one or more alkyl, alkene, and/or alkyne groups containing, e.g., 1-5 carbon atoms. Examples include but are not limited to trimethylsilane (3MS), dimethylsilane (2MS), triethylsilane (TES), and pentamethyldisilamethane. Additionally, disilanes, trisilanes, or other higher silanes may be used in place of monosilanes. An example of one such disilane from the alkyl silane class is hexamethyldisilane (HMDS). Another example of a disilane from the alkyl silane class can include pentamethyldisilane (PMDS). Other types of alkyl silanes can include alkylcarbosilanes, which can have a branched polymeric structure with a carbon bonded to a silicon atom as well as alkyl groups bonded to a silicon atom. Examples include dimethyl trimethylsilyl methane (DTMSM) and bis-dimethylsilyl ethane (BDMSE). For depositing nitrogen doped silicon carbide (SiNC) films, examples of suitable precursors include, e.g., alkyldisilazanes and possibly compounds including amino (—NH$_2$) and alkyl groups separately bonded to one or more silicon atoms. Alkyldisilazanes include silazanes and alkyl groups bonded to two silicon atoms. An example includes 1,1,3,3-tetramethyldisilazane (TMDSN).

In some embodiments, the first precursor is a metal-containing precursor. Example precursors may include metal alkylamines, metal alkoxides, metal alkylamides, metal halides, metal β-diketonates, metal carbonyls, etc. The metal-containing precursors may also include organometallic compounds such as alkyl metal compounds as well as metal halides having a high vapor pressure under deposition conditions. Such compounds exist in a vapor state and are readily delivered to the substrate and adsorb thereon. Some methods described herein may be suitable for ALD deposition of metal-containing films. Examples of metals include titanium (Ti), hafnium (Hf), zirconium (Zr), manganese (Mn), tungsten (W), and tantalum (Ta). Appropriate metal-containing precursors will include the metal that is desired to be incorporated into the film. For example, a tantalum-containing layer may be deposited by reacting pentakis (dimethylamido)tantalum with ammonia or another reducing agent as a second reactant. Further examples of metal-containing precursors that may be employed include trimethylaluminum, aluminum acetate, alkoxide, aluminum halidte, traethoxytitanium, tetrakis-dimethyl-amido titanium, hafnium tetrakis(ethylmethylamide), bis(cyclopentadienyl)manganese, bis(n-propylcyclopentadienyl)magnesium, tridimethylaminotitanium (TDMAT), tetraethoxytitanium, tetrakis-dimethyl-amido titanium, titanium isopropoxide, titanium tetraisopropoxide, and compounds having the formula TiX$_n$, where n is an integer between and including 2 through 4, and X is a halide. Specific examples include TiI$_4$, TiCl$_4$, TiF$_4$, and TiBr$_4$.

Operation 103 may correspond to first precursor exposure phase 220A of FIG. 2. During the first precursor exposure phase 220A, the first precursor is flowed with an optional purge or carrier gas, and the plasma and second reactant are turned off.

Returning to FIG. 1, in operation 105, the process chamber is optionally purged to remove excess first precursor in gas phase that did not adsorb onto the surface of the substrate. Purging may involve a sweep gas, which may be a carrier gas used in other operations or a different gas. Sweeping the process station may avoid gas phase reactions where the second reactant is unstable to plasma activation or where unwanted species might be formed. Further, sweeping the process station may remove surface adsorbed ligands that may otherwise remain and contaminate the film. In some embodiments, purging may involve evacuating the chamber.

Operation 105 may correspond to purge phase 240A of FIG. 2. Purge phase 240A may have any suitable duration. In some embodiments, increasing a flow rate of a one or more purge gases may decrease the duration of purge phase 240A. For example, a purge gas flow rate may be adjusted according to various reactant thermodynamic characteristics and/or geometric characteristics of the process station and/or process station plumbing for modifying the duration of purge phase 240A. In one non-limiting example, the duration of a purge phase may be optimized by adjustment of the purge gas flow rate. This may reduce deposition cycle time, which may improve substrate throughput.

In some embodiments, purge phase 240A may include one or more evacuation subphases for evacuating the process station. Alternatively, it will be appreciated that purge phase 240A may be omitted in some embodiments. Purge phase 240A may have any suitable duration, such as between about 0 seconds and about 60 seconds, or about 0.01 seconds. In some embodiments, increasing a flow rate of a one or more purge gases may decrease the duration of purge phase 240A. For example, a purge gas flow rate may be adjusted according to various reactant thermodynamic characteristics and/or geometric characteristics of the process station and/or process station plumbing for modifying the duration of purge phase 240A. In one non-limiting example, the duration of a purge phase may be adjusted by modulating sweep gas flow rate. This may reduce deposition cycle time, which may improve substrate throughput. After a purge, the silicon-containing precursors remain adsorbed onto the substrate surface.

Returning to FIG. 1, in operation 111, the substrate is exposed to a second reactant and a plasma is ignited. The substrate is exposed to the second reactant for a duration sufficient to form a layer of material by a reaction on the surface of the substrate.

"Plasma" refers to a plasma ignited in a reaction chamber or remotely and brought into the reaction chamber. Plasmas can include the reactants described herein and may include other agents, for example, a carrier gas, or reactive species such as hydrogen gas. The reactants and other agents may be present in a reaction chamber when a plasma is struck, or a remote plasma may be flowed into a chamber where the reactants are present and/or the reactants and/or carrier gas may be ignited into a plasma remotely and brought into the reaction chamber. A "plasma" is meant to include any plasma known to be technologically feasible, including inductively-coupled plasmas and microwave surface wave plasmas.

In various embodiments, the plasma is an in-situ plasma, such that the plasma is formed directly above the substrate surface in the chamber. The in-situ plasma may be ignited at a power per substrate area between about 0.2122 W/cm$^2$ and about 2.122 W/cm$^2$. For example, the power may range from about 600 W to about 6000 W for a chamber processing four 300 mm wafers. Plasmas for ALD processes may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. Residual gases in the chamber that are not used to deposit the film by ALD affect the ionization of gases during operation 111, thereby reducing the quality of the film being deposited. For example, if any helium is adsorbed on the surface of the substrate from prior processing, the plasma ignited in operation 111 has a purple color typical of helium plasma and not usually used in ALD processes, thereby causing the deposited film on the film to be thinner than desired. By using a soak gas in operation 150 that is one or more gases used in operation 111, the quality and thickness of the film to be deposited and formed in operation 111 is preserved. For example, for a deposition of a silicon oxide film, if the soak gas used in operation 150 is a mixture of oxygen and nitrous oxide in a ratio of about 1:1, then if the same gases and same mixture ratios of gases are used in operation 111, the quality or thickness of the deposited silicon oxide film may not be affected by the soak gas. This may insure that the soak gas may be used multiple times in the deposition process, such as every time a new substrate is inserted into a chamber, without affecting the deposited films.

During operation 111, it will be appreciated that the RF field may be coupled via any suitable electrodes. Non-limiting examples of electrodes include process gas distribution showerheads and substrate support pedestals. It will be appreciated that plasmas for ALD processes may be formed by one or more suitable methods other than capacitive coupling of an RF field to a gas. In some embodiments, the plasma is a remote plasma, such that the second reactant is ignited in a remote plasma generator upstream of the station, then delivered to the station where the substrate is housed.

The second reactant may be an oxidant or reductant. In various embodiments, the second reactant is an oxygen-containing reactant, or a nitrogen-containing reactant, or a halogen-containing reactant, or a carbon-containing reactant, or a dopant. The second reactant may include one or more of these compounds.

Example oxidants include, but are not limited to, ozone ($O_3$), peroxides including hydrogen peroxide ($H_2O_2$), oxygen ($O_2$), water ($H_2O$), alcohols such as methanol, ethanol, and isopropanol, nitric oxide (NO), nitrous dioxide ($NO_2$) nitrous oxide ($N_2O$), carbon monoxide (CO) and carbon dioxide ($CO_2$). Example oxygen-containing reactants include oxygen, ozone, nitrous oxide, nitric oxide, nitrogen dioxide, carbon monoxide, carbon dioxide, sulfur monoxide, sulfur dioxide, water, oxygen-containing hydrocarbons ($C_xH_yO_z$), etc.

A nitrogen-containing reactant contains at least one nitrogen, for example, $N_2$, ammonia, hydrazine, amines (amines bearing carbon) such as methylamine, dimethylamine, ethylamine, isopropylamine, t-butylamine, di-t-butylamine, cyclopropylamine, sec-butylamine, cyclobutylamine, iso-amylamine, 2-methylbutan-2-amine, trimethylamine, diisopropylamine, diethylisopropylamine, ethylenediamine, tert-butylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, tertbutylamine (TBA), t-butyloxycarbonyl amine and N-t-butyl hydroxylamine are nitrogen-containing reactants.

In some embodiments, the flow rate of the second reactant may be between about 0.1 slm and about 20 slm (e.g., between about 1 slm and about 10 slm). In some embodiments, a carrier gas may be used during the exposure to the second reactant. An example of a suitable carrier gas is nitrogen ($N_2$), and if nitrogen is used as a carrier gas and co-flowed with the second reactant, the nitrogen may be flowed at a flow rate between about 500 sccm and 10 slm.

Operation 111 may correspond to second reactant with plasma exposure phase 260A. As shown in FIG. 2, during 260A, the plasma and second reactant are turned on, with an optional purge or carrier gas, while the first precursor flow is turned off. In many embodiments, the substrate is exposed to the second reactant for a time between about 1 second and about 60 seconds, or about 2.5 seconds, or about 30 seconds.

Returning to FIG. 1, in operation 113, the chamber is optionally purged with a purge gas. The purge gas may be any purge gas described above with respect to operation 105. The purge gas may be flowed for a duration sufficient to remove excess byproducts from the chamber. This operation may correspond to purge phase 280A of FIG. 2, whereby the purge gas flows while the first precursor, plasma, and second reactant are turned off.

In operation 115 of FIG. 1, it is determined whether the film has been deposited to an adequate thickness. If not, operations 103-113 are repeated in cycles. At least about two deposition cycles or more may be included in disclosed embodiments to deposit a desired film thickness. For example, between about 2 and about 50 cycles may be performed, or between about 2 and about 30 cycles, or between about 2 and about 20 cycles, or between about 2 and about 10 cycles.

FIG. 2 depicts two deposition cycles 210A and 210B. As shown, in deposition cycle 210B, operations in FIG. 1 are repeated such that the substrate is exposed to the first precursor during first precursor exposure phase 220B, the chamber is purged in purge phase 240B, the substrate is exposed to a second reactant with plasma in operation 260B, and the chamber is purged yet again in purge phase 280B.

Apparatus

Figure 3:
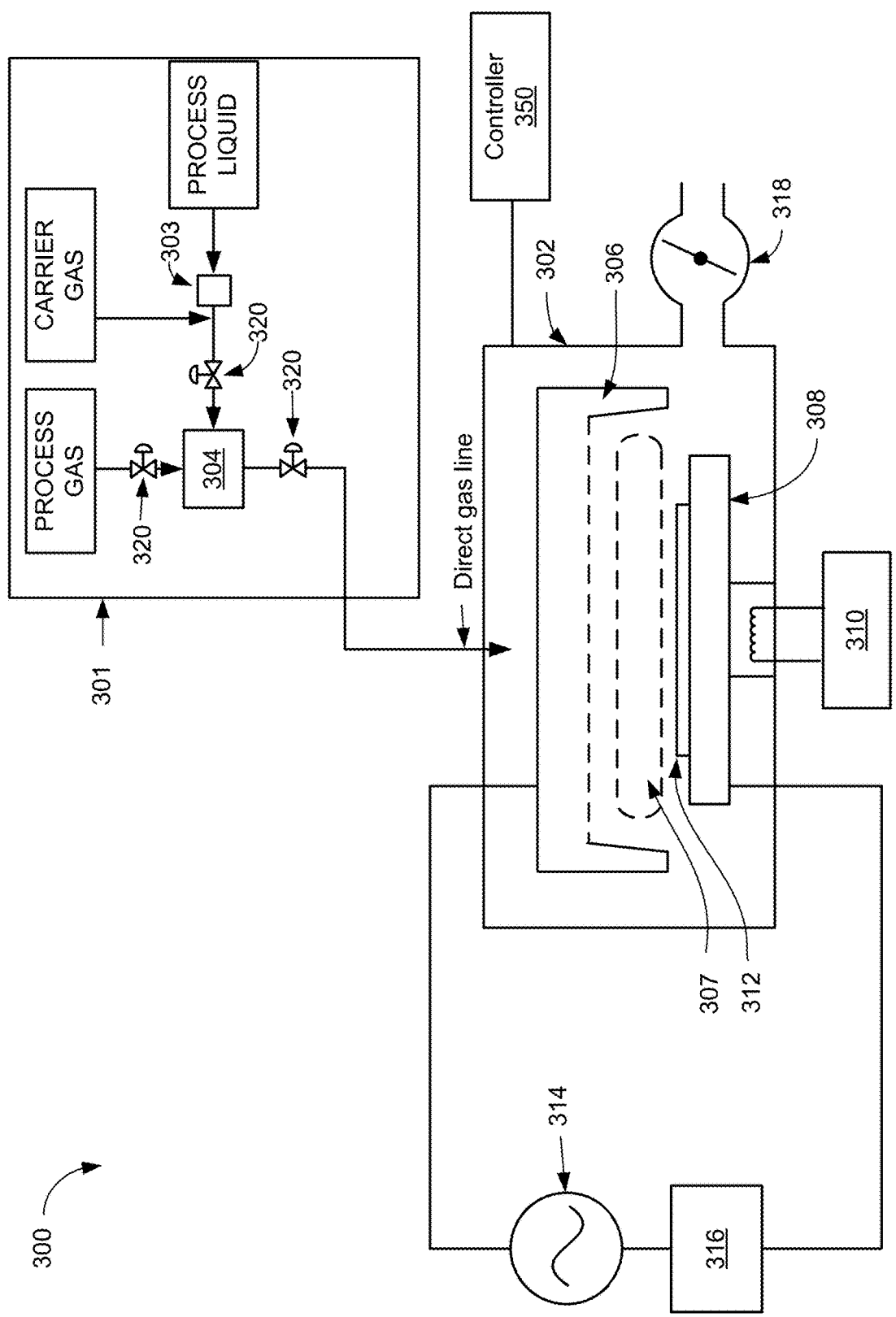
FIG. 3 is a schematic diagram of an example process station for performing disclosed embodiments.
Figure 4:
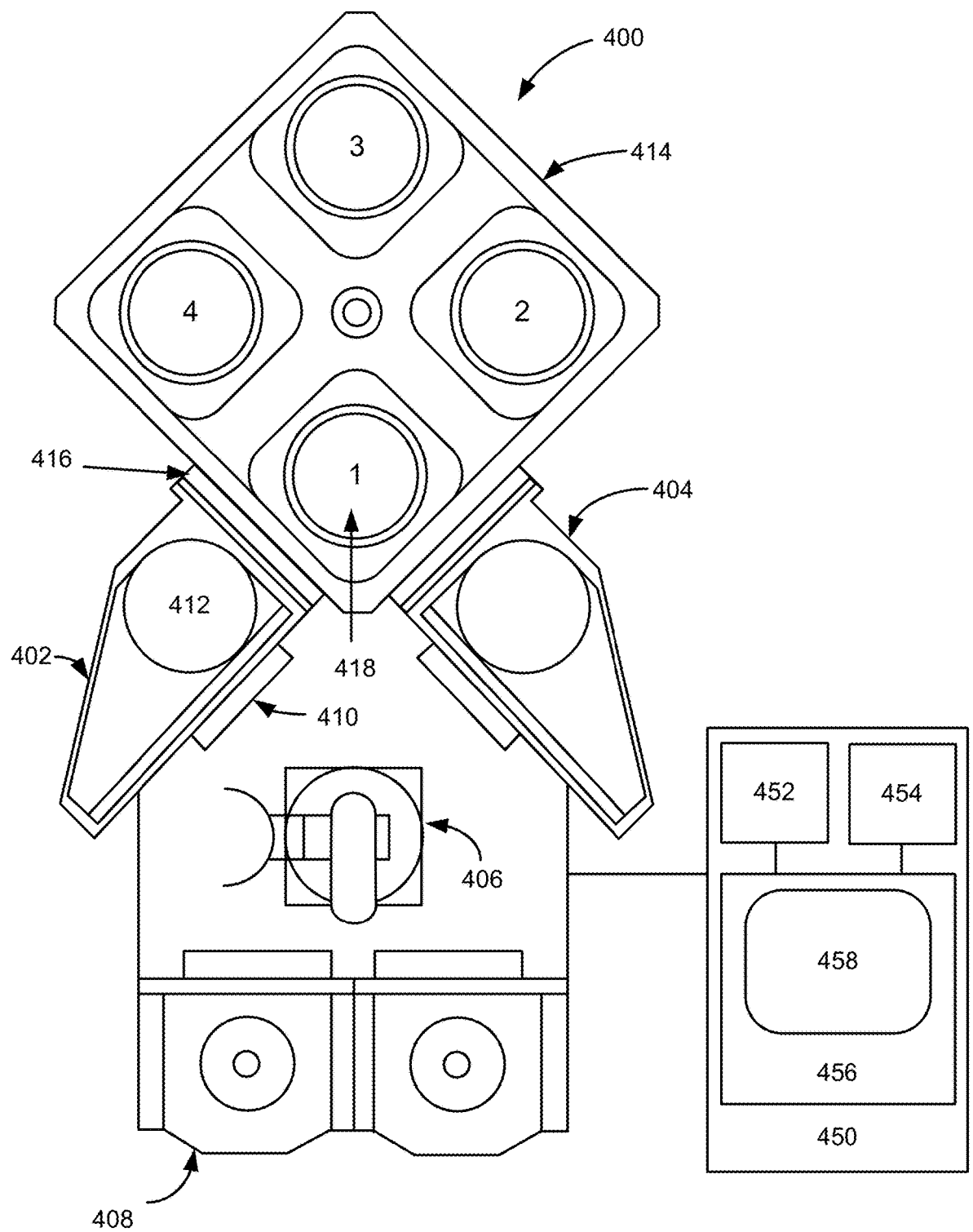
FIG. 4 is a schematic diagram of an example process tool for performing disclosed embodiments.

FIG. 3 depicts a schematic illustration of an embodiment of an atomic layer deposition (ALD) process station 300 having a process chamber body 302 for maintaining a low-pressure environment. A plurality of ALD process stations 300 may be included in a common low pressure process tool environment. For example, FIG. 4 depicts an embodiment of a multi-station processing tool 400. In some embodiments, one or more hardware parameters of ALD process station 300, including those discussed in detail below, may be adjusted programmatically by one or more computer controllers 350.

ALD process station 300 fluidly communicates with reactant delivery system 301 for delivering process gases to a distribution showerhead 306. Reactant delivery system 301 includes a mixing vessel 304 for blending and/or conditioning process gases for delivery to showerhead 306. One or more mixing vessel inlet valves 320 may control introduction of process gases to mixing vessel 304.

As an example, the embodiment of FIG. 3 includes a vaporization point 303 for vaporizing liquid reactant to be supplied to the mixing vessel 304. In some embodiments, vaporization point 303 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 303 may be heat traced. In some examples, mixing vessel 304 may also be heat traced. In one non-limiting example, piping downstream of vaporization point 303 has an increasing temperature profile extending from approximately 100° C. to approximately 150° C. at mixing vessel 304.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 303. In one scenario, a liquid injector may be mounted directly to mixing vessel 304. In another scenario, a liquid injector may be mounted directly to showerhead 306.

In some embodiments, a liquid flow controller (LFC) upstream of vaporization point 303 may be provided for controlling a mass flow of liquid for vaporization and delivery to process station 300. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 306 distributes process gases toward substrate 312. In the embodiment shown in FIG. 3, the substrate 312 is located beneath showerhead 306 and is shown resting on a pedestal 308. Showerhead 306 may have any suitable shape, and may have any suitable number and arrangement of ports for distributing process gases to substrate 312. Example process gases include soak gases, first precursor gases, carrier gases or purge gases, and second reactant gases.

In some embodiments, a microvolume 307 is located beneath showerhead 306. Practicing disclosed embodiments in a microvolume rather than in the entire volume of a process station may reduce reactant exposure and purge times, may reduce times for altering process conditions (e.g., pressure, temperature, etc.) may limit an exposure of process station robotics to process gases, etc. Example microvolume sizes include, but are not limited to, volumes between 0.1 liter and 2 liters. This also impacts productivity throughput. In some embodiments, the disclosed embodiments are not performed in a microvolume.

In some embodiments, pedestal 308 may be raised or lowered to expose substrate 312 to microvolume 307 and/or to vary a volume of microvolume 307. For example, in a substrate transfer phase, pedestal 308 may be raised to position substrate 312 within microvolume 307. In some embodiments, microvolume 307 may completely enclose substrate 312 as well as a portion of pedestal 308 to create a region of high flow impedance.

Optionally, pedestal 308 may be lowered and/or raised during portions the process to modulate process pressure, reactant concentration, etc., within microvolume 307. In one scenario where process chamber body 302 remains at a base pressure during the process, lowering pedestal 308 may allow microvolume 307 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller 350.

In another scenario, adjusting a height of pedestal 308 may allow a plasma density to be varied during plasma activation and/or treatment cycles included in the process. At the conclusion of the process phase, pedestal 308 may be lowered during another substrate transfer phase to allow removal of substrate 312 from pedestal 308.

While the example microvolume variations described herein refer to a height-adjustable pedestal, it will be appreciated that, in some embodiments, a position of showerhead 306 may be adjusted relative to pedestal 308 to vary a volume of microvolume 307. Further, it will be appreciated that a vertical position of pedestal 308 and/or showerhead 306 may be varied by any suitable mechanism within the scope of the present disclosure. In some embodiments, pedestal 308 may include a rotational axis for rotating an orientation of substrate 312. It will be appreciated that, in some embodiments, one or more of these example adjustments may be performed programmatically by one or more suitable computer controllers 350.

In some embodiments where plasma may be used as discussed above, showerhead 306 and pedestal 308 electrically communicate with a radio frequency (RF) power supply 314 and matching network 316 for powering a plasma. In some embodiments, the plasma energy may be controlled by controlling one or more of a process station pressure, a gas concentration, an RF source power, an RF source frequency, and a plasma power pulse timing. For example, RF power supply 314 and matching network 316 may be operated at any suitable power to form a plasma having a desired composition of radical species. Examples of suitable powers are included above. Likewise, RF power supply 314 may provide RF power of any suitable frequency. In some embodiments, RF power supply 314 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz, for example 2 MHz, 13.56 MHz, or 27 MHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 350 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the second reactant) as a soak gas, instructions for setting a flow rate of a carrier gas (such as nitrogen), instructions for setting a pedestal temperature, and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for setting a flow rate of an inert and/or reactant gas (e.g., the first precursor), instructions for modulating a flow rate of a carrier gas, and time delay instructions for the third recipe phase. A fourth recipe phase may include instructions for modulating or stopping a flow rate of an inert and/or a reactant gas, instructions for modulating the flow rate of a carrier or purge gas, and time delay instructions for the fourth recipe phase. A fifth recipe phase may include instructions for setting a flow rate of an inert and/or reactant gas which may be the same as or different from the gas used in the first recipe phase (e.g., the second reactant), instructions for modulating a flow rate of a carrier gas, and time delay instructions for the fifth recipe phase. It will be appreciated that these recipe phases may be further subdivided and/or iterated in any suitable way within the scope of the present disclosure.

In some embodiments, pedestal 308 may be temperature controlled via heater 310. The pedestal may be set to a deposition temperature. For example, the pedestal may be set to a temperature between about 200° C. and about 300° C. for deposition of a nitride or carbide. Further, in some embodiments, pressure control for process station 300 may be provided by butterfly valve 318. As shown in the embodiment of FIG. 3, butterfly valve 318 throttles a vacuum provided by a downstream vacuum pump (not shown). However, in some embodiments, pressure control of process station 300 may also be adjusted by varying a flow rate of one or more gases introduced to the process station 300.

As described above, one or more process stations may be included in a multi-station processing tool. FIG. 4 shows a schematic view of an embodiment of a multi-station processing tool 400 with an inbound load lock 402 and an outbound load lock 404, either or both of which may comprise a remote plasma source. A robot 406, at atmospheric pressure, is configured to move substrates or wafers from a cassette loaded through a pod 408 into inbound load lock 402 via an atmospheric port 410. A substrate is placed by the robot 406 on a pedestal 412 in the inbound load lock 402, the atmospheric port 410 is closed, and the load lock is pumped down. Where the inbound load lock 402 comprises a remote plasma source, the substrate may be exposed to a remote plasma treatment in the load lock prior to being introduced into a processing chamber 414. Further, the substrate also may be heated in the inbound load lock 402 as well, for example, to remove moisture and adsorbed gases. Next, a chamber transport port 416 to processing chamber 414 is opened, and another robot (not shown) places the substrate into the reactor on a pedestal of a first station shown in the reactor for processing. While the embodiment depicted in FIG. 4 includes load locks, it will be appreciated that, in some embodiments, direct entry of a substrate into a process station may be provided. In various embodiments, the soak gas is introduced to the station when the substrate is placed by the robot 406 on the pedestal 412.

The depicted processing chamber 414 comprises four process stations, numbered from 1 to 4 in the embodiment shown in FIG. 4. Each station has a heated pedestal (shown at 418 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 414 may include one or more matched pairs of ALD and plasma-enhanced ALD process stations. While the depicted processing chamber 414 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 4 depicts an embodiment of a wafer handling system for transferring substrates within processing chamber 414. In some embodiments, wafer handling system may transfer substrates between various process stations and/or between a process station and a load lock. It will be appreciated that any suitable wafer handling system may be employed. Non-limiting examples include wafer carousels and wafer handling robots. FIG. 4 also depicts an embodiment of a system controller 450 employed to control process conditions and hardware states of process tool 400. System controller 450 may include one or more memory devices 456, one or more mass storage devices 454, and one or more processors 452. Processor 452 may include a CPU or computer, analog and/or digital input/output connections, stepper motor controller boards, etc.

In some embodiments, system controller 450 controls all of the activities of process tool 400. System controller 450 executes system control software 458 stored in mass storage device 454, loaded into memory device 456, and executed on processor 452. Alternatively, the control logic may be hard coded in the controller 450. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 458 may include instructions for controlling the timing, mixture of gases, amount of gas flow, chamber and/or station pressure, chamber and/or station temperature, substrate temperature, target power levels, RF power levels, substrate pedestal, chuck and/or susceptor position, and other parameters of a particular process performed by process tool 400. System control software 458 may be configured in any suitable way. For example, various process tool component subroutines or control objects may be written to control operation of the process tool components used to carry out various process tool processes. System control software 458 may be coded in any suitable computer readable programming language.

In some embodiments, system control software 458 may include input/output control (IOC) sequencing instructions for controlling the various parameters described above. Other computer software and/or programs stored on mass storage device 454 and/or memory device 456 associated with system controller 450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 418 and to control the spacing between the substrate and other parts of process tool 400.

A process gas control program may include code for controlling gas composition (e.g., first precursor gas, soak gas, second reactant gas, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as the soak gas) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 450. The user interface may include a display screen, graphical software displays of the apparatus and/or process conditions, and user input devices such as pointing devices, keyboards, touch screens, microphones, etc.

In some embodiments, parameters adjusted by system controller 450 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 450 from various process tool sensors. The signals for controlling the process may be output on the analog and digital output connections of process tool 400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 450 may provide program instructions for implementing the above-described deposition processes such as processes that employ a soak prior to initiating ALD for a substrate inserted into the reaction chamber, with the soak performed under any of the soak conditions described herein. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller.

In some implementations, the system controller 450 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 450, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 450 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 450 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 450, in some implementations, may be a part of or coupled to a computer that is integrated with, coupled to the system, otherwise networked to the system, or a combination thereof. For example, the system controller 450 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 450 receives instructions in the form of data, which specify parameters for each of the processing steps to be performed during one or more operations. It should be understood that the parameters may be specific to the type of process to be performed and the type of tool that the system controller 450 is configured to interface with or control. Thus as described above, the system controller 450 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 450 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399, filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

An experiment was conducted comparing film thickness between films deposited by ALD using helium as a soak gas prior to ALD and films deposited using gases to be used during the plasma environment operation of ALD prior to ALD. The pedestal was set to a temperature of 50° C. Substrates were placed on the pedestal to bring the substrate temperature up to 50° C. from room temperature.

In one trial, the substrate was exposed to a helium soak gas for seven seconds prior to performing ALD cycles sufficient to deposit 8.8 Å of silicon oxide. Only 5.0 Å of silicon oxide was deposited. In a second trial, the substrate was exposed to an argon soak gas for nine seconds prior to performing ALD cycles sufficient to deposit 8.8 Å of silicon oxide. Argon was used as a carrier gas during the oxidant exposure with plasma in the ALD cycle. The thickness of the silicon oxide film deposited was 8.7 Å. In a third trial, the substrate was exposed to a mixture of nitrous oxide ($N_2O$) and oxygen ($O_2$) for nine seconds prior to performing ALD cycles sufficient to deposit 8.8 Å of silicon oxide. The same mixture of $N_2O$ and $O_2$ was used in each cycle during the oxidant exposure with plasma phase. The thickness of the silicon oxide film deposited was 8.7 Å. In the fourth trial, the substrate was exposed to nitrogen ($N_2$) for nine seconds prior to performing ALD cycles sufficient to deposit 8.8 Å of silicon oxide. Nitrogen was used as a carrier gas in each cycle during the oxidant exposure with plasma phase. The thickness of the silicon oxide film deposited was 8.6 Å. As shown in Table 1 below, films deposited using gases that were used in the second reactant phase with plasma of the ALD cycle achieved thicknesses closer to the thickness to be deposited as measured by the number of ALD cycles. Using a helium soak resulted in a film thickness sufficiently lower than desired.

TABLE 1

Thickness of Silicon Oxide Films Deposited with Soak Gases

| Soak Chemistry | Thickness Deposited |
|---|---|
| Helium only | 5.0 Å |
| Ar | 8.7 Å |
| $N_2O/O_2$ | 8.7 Å |
| $N_2$ | 8.6 Å |

Experiment 2

An experiment was conducted to measure the wafer-to-wafer variation between films deposited using disclosed embodiments. One hundred substrates were deposited using the same sequence of ALD cycles in a four-station tool. The tool was indexed after sufficient cycles were deposited for each substrate. Each time a substrate was inserted into the tool, the tool introduced nitrogen ($N_2$) as a soak gas for 60 seconds before resuming the ALD cycles. Each ALD cycle included exposure to $N_2$, purging with $N_2$ purge gas, exposure to nitrous oxide ($N_2O$) and oxygen ($O_2$) and a plasma, and purging with $N_2$ purge gas. Each substrate was exposed to sufficient ALD cycles to ideally deposit 8.8 Å of silicon oxide.

Figure 5:
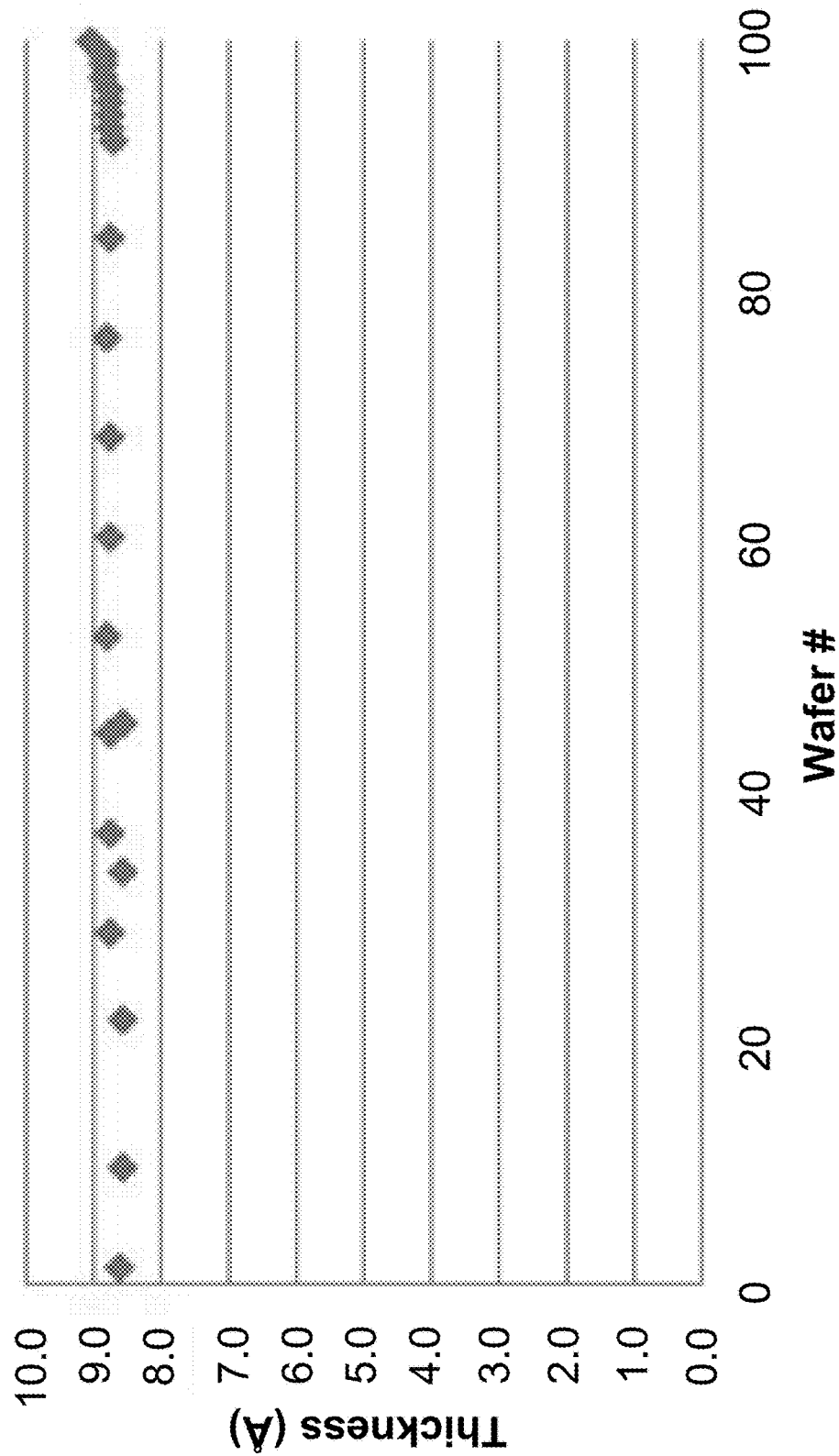
FIG. 5 is graph depicting experimental results from an experiment conducted in accordance with disclosed embodiments.

One set of experimental data obtained for thickness of films deposited for various wafers is shown in FIG. 5. The line priming time for this set of experimental data was 7 seconds. The wafers shown in FIG. 5 yielded films with similar thickness at or around 8.8 Å, suggesting that disclosed embodiments can exhibit high consistency in repeatability.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:
1. A method for depositing silicon oxide films by plasma-enhanced atomic layer deposition on semiconductor substrates, the method comprising:
(a) inserting a first semiconductor substrate into a chamber;
(b) after inserting the first semiconductor substrate into the chamber and prior to performing a first cycle of plasma-enhanced atomic layer deposition (PEALD) at a deposition temperature, raising the first semiconductor substrate's temperature to about the deposition temperature by exposing the first semiconductor substrate to a helium-free soak gas for a duration of about 500 seconds or less to reduce wafer-to-wafer variation compared to semiconductor substrates processed using a helium-containing soak gas prior to performing the PEALD on a first semiconductor substrate;
(c) performing the PEALD to deposit a first silicon oxide film on the first semiconductor substrate; and
(d) after depositing the first silicon oxide film on the first semiconductor substrate, performing the PEALD in one or more cycles to deposit a second silicon oxide film on a second semiconductor substrate,
wherein a cycle of the PEALD comprises
exposing the substrate to a silicon-containing precursor in a non-plasma environment for a duration sufficient to substantially adsorb the silicon-containing precursor to a surface of the substrate and
exposing the substrate to reactant gases comprising an inert gas and an oxidant in a plasma environment to form at least a portion of the silicon oxide film,
wherein the soak gas contains the reactant gases,
wherein the inert gas is selected from the group consisting of nitrogen, argon, and combinations thereof,
wherein the oxidant selected from the group consisting of oxygen and nitrous oxide, and combinations thereof, and
wherein the first silicon oxide film is deposited to a thickness of less than about 5 nm.

2. The method of claim 1, wherein proportion of gases in the soak gas is substantially the same as proportion of the gases during the exposing of the substrate to the reactant gases in the cycle of PEALD.

3. The method of claim 1, wherein flow rate of the soak gas in (b) is within about 10% of a maximum flow rate achievable by the chamber.

4. The method of claim 3, wherein flow rate of the soak gas in (b) is at least about 15 slm.

5. The method of claim 1, wherein flow rate of the soak gas in (b) is at least about 25% to about 200% of flow rate of the reactant gases.

6. The method of claim 1, wherein wafer-to-wafer variation between average thickness of the first silicon oxide film and the second silicon oxide film is less than about ±2 Å.

7. The method of claim 1, wherein between two and about fifty cycles of the PEALD are performed on each semiconductor substrate.

8. The method of claim 1, wherein the first semiconductor substrate is exposed to the soak gas for a duration between about 5 seconds and about 60 seconds.

9. The method of claim 1, wherein the soak gas is a temperature-stabilizing soak gas that stabilizes the first semiconductor substrate's temperature.

10. The method of claim 1, wherein the wafer-to-wafer variation between average thickness of the first silicon oxide film and the second silicon oxide film is less than about ±2 Å.

11. A method for depositing a film by plasma-enhanced atomic layer deposition on semiconductor substrates, the method comprising:
(a) inserting a first semiconductor substrate into a chamber; and
(b) after inserting the first semiconductor substrate into the chamber and prior to performing a first cycle of plasma-enhanced atomic layer deposition (PEALD) at a deposition temperature, raising the first semiconductor substrate's temperature to about the deposition temperature by exposing the first semiconductor substrate to a helium-free soak gas for a duration of about 500 seconds or less to reduce wafer-to-wafer variation compared to semiconductor substrates processed using a helium-containing soak gas prior to performing the PEALD on a first semiconductor substrate;

(c) performing the PEALD to deposit a first film on the first semiconductor substrate; and (d) after depositing the first film on the first semiconductor substrate, performing the PEALD in one or more cycles to deposit a second film on a second semiconductor substrate, wherein a cycle of the PEALD comprises exposing the substrate to a precursor in a non-plasma environment for a duration sufficient to substantially adsorb the precursor to a surface of the substrate, exposing the substrate to a second reactant comprising an inert gas and oxygen-containing gas in a plasma environment to form at least a portion of the film, wherein the soak gas contains the second reactant wherein the inert gas is selected from the group consisting of nitrogen, argon, and combinations thereof, wherein the oxygen-containing gas is selected from the group consisting of oxygen and nitrous oxide, and combinations thereof, and wherein the first film is deposited to a thickness of less than about 5 nm.

12. The method of claim 11, wherein the proportion of gases in the soak gas is substantially the same as the proportion of gases in the second reactant during the exposing of the substrate to the second reactant in the cycle of PEALD.

13. The method of claim 11, wherein flow rate of the soak gas in (b) is within 10% of a maximum flow rate achievable by the chamber.

14. The method of claim 13, wherein the flow rate of the soak gas in (b) is at least about 15 slm.

15. The method of claim 11, wherein flow rate of the soak gas in (b) is at least about 25% to about 200% of the flow rate of the second reactant used when exposing the first semiconductor substrate to the second reactant in the plasma environment during the cycle of the PEALD.

16. The method of claim 11, wherein the wafer-to-wafer variation of an average thickness of the first and second films deposited on at least the first and the second semiconductor substrates is less than about ±2 Å.

17. The method of claim 11, wherein the soak gas is a temperature-stabilizing soak gas that stabilizes the first semiconductor substrate's temperature.

18. A method for depositing silicon oxide films by plasma-enhanced atomic layer deposition on three or more semiconductor substrates, the method comprising:

(a) inserting a first semiconductor substrate into a chamber;

(b) after inserting the first semiconductor substrate into the chamber and prior to performing a first cycle of plasma-enhanced atomic layer deposition (PEALD) on the first semiconductor substrate at a deposition temperature, raising the first semiconductor substrate's temperature to about the deposition temperature by exposing the first semiconductor substrate to a helium-free soak gas for a duration of about 500 seconds or less;

(c) performing n cycles of the PEALD to deposit a first silicon oxide film on the first semiconductor substrate;

(d) after removing the first semiconductor substrate having the first silicon oxide film from the chamber and inserting a second semiconductor substrate into the chamber, performing the n cycles of the PEALD on the second semiconductor substrate to deposit a second silicon oxide film; and (f) after removing the second semiconductor substrate having the second silicon oxide film from the chamber and inserting a third semiconductor substrate into the chamber, performing the n cycles of the PEALD on the third semiconductor substrate to deposit a third silicon oxide film, wherein each of the n cycles of the PEALD comprises exposing the semiconductor substrate to a silicon-containing precursor in a non-plasma environment for a duration sufficient to substantially adsorb the silicon-containing precursor to a surface of the semiconductor substrate and exposing the semiconductor substrate to an oxidant in a plasma environment to form at least a portion of the silicon oxide film, wherein the helium-free soak gas contains one or more gases of the oxidant used when exposing the first semiconductor substrate to the oxidant in the plasma environment during the cycle of the PEALD, wherein the n cycles of PEALD are performed to deposit less than about 5 nm of silicon oxide on the second and third semiconductor substrates, and wherein wafer-to-wafer variation of an average thickness of the first, second, and third silicon oxide films deposited on the three or more semiconductor substrates is less than about ±2 Å.

19. The method of claim 18, wherein the helium-free soak gas is a temperature-stabilizing soak gas that stabilizes the first semiconductor substrate's temperature.

* * * * *